(12) United States Patent
Lai et al.

(10) Patent No.: US 11,404,397 B2
(45) Date of Patent: Aug. 2, 2022

(54) DISPLAY PANEL

(71) Applicant: PlayNitride Inc., Tainan (TW)

(72) Inventors: Yu-Hung Lai, Tainan (TW);
Kuan-Yung Liao, Tainan (TW);
Sheng-Chieh Liang, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 294 days.

(21) Appl. No.: 16/027,272

(22) Filed: Jul. 4, 2018

(65) Prior Publication Data
US 2019/0013297 A1    Jan. 10, 2019

(30) Foreign Application Priority Data

Jul. 5, 2017   (TW) .................................. 106122469

(51) Int. Cl.
*H01L 25/075*   (2006.01)
*H01L 33/38*   (2010.01)
*H01L 33/62*   (2010.01)

(52) U.S. Cl.
CPC ........ *H01L 25/0753* (2013.01); *H01L 33/382* (2013.01); *H01L 33/387* (2013.01); *H01L 33/62* (2013.01); *H01L 2933/0066* (2013.01)

(58) Field of Classification Search
CPC ......... H01L 25/18; H01L 25/075–0756; H01L 25/13; H01L 25/16–167; H01L 33/382; H01L 33/387; H01L 33/62
See application file for complete search history.

(56) References Cited

U.S. PATENT DOCUMENTS

| 2010/0200884 | A1 | 8/2010 | Lee et al. |
| 2015/0048349 | A1 | 2/2015 | Kawata et al. |
| 2015/0340346 | A1 | 11/2015 | Chu et al. |
| 2016/0141474 | A1* | 5/2016 | Huang ................. H01L 33/382 |
| | | | 257/98 |

(Continued)

FOREIGN PATENT DOCUMENTS

| TW | 201216474 | 4/2012 |
| TW | I447975 | 8/2014 |

(Continued)

OTHER PUBLICATIONS

"Office Action of China Counterpart Application", dated Aug. 26, 2021, p. 1-p. 6.

*Primary Examiner* — Julio J Maldonado
*Assistant Examiner* — Stanetta D Isaac
(74) *Attorney, Agent, or Firm* — JCIPRNET

(57) ABSTRACT

A display panel including a substrate, a buffer insulating layer, a plurality of pads, and a plurality of light emitting diodes is provided. The substrate has a display area and a peripheral area adjacent to the display area. The buffer insulating layer is disposed on the substrate. The Young's modulus of the buffer insulating layer is less than 10 GPa. The pads are located on the buffer insulating layer and disposed on the display area of the substrate. The light emitting diodes are electrically connected to the pads and bonding to the display area of the substrate by the pads. The buffer insulating layer is located between the light emitting diodes and the substrate. A normal projection of the light emitting diodes on the substrate is at least partially overlapped with a normal projection of the buffer insulating layer on the substrate.

19 Claims, 9 Drawing Sheets

(56) References Cited

U.S. PATENT DOCUMENTS

2016/0329468 A1   11/2016  Akram et al.
2017/0323873 A1*  11/2017  Lin .......................... H01L 24/95
2017/0345801 A1*  11/2017  Lin ..................... H01L 33/0093
2018/0151835 A1*   5/2018  Kim .................... H01L 51/5253
2019/0312015 A1*  10/2019  Lau ..................... H01L 25/0753

FOREIGN PATENT DOCUMENTS

TW         I470845      1/2015
TW        201711227     3/2017
TW         I578582      4/2017

* cited by examiner

DISPLAY PANEL

CROSS-REFERENCE TO RELATED APPLICATION

This application claims the priority benefit of Taiwan application serial no. 106122469, filed on Jul. 5, 2017. The entirety of the above-mentioned patent application is hereby incorporated by reference herein and made a part of this specification.

BACKGROUND OF THE INVENTION

1. Field of the Invention

The invention relates to a display apparatus. More particularly, the invention relates to a micro LED display panel.

2. Description of Related Art

Generally, a light-emitting chip is constituted by an epitaxial structure, an N-type electrode, and a P-type electrode, and the N-type electrode and the P-type electrode are respectively in contact with an N-type semiconductor layer and a P-type semiconductor layer. For end-product applications, for example, the light emitting chips will bond onto a circuit substrate to manufacture a light emitting module or a display module through metal bonding with high temperature process. Since thermal expansion coefficients of materials of the light emitting chips and the circuit substrate are mismatched, the process yield of chips bonding will be impaired and the end-product may have low structural reliability.

SUMMARY OF THE INVENTION

The invention provides a display panel which has favorable structural reliability.

A display panel provided by an embodiment of the invention includes a substrate, a buffer insulating layer, a plurality of pads, and a plurality of light emitting diodes. The substrate has a display area and a peripheral area adjacent to the display area. The buffer insulating layer is disposed on the substrate. The Young's modulus of the buffer insulating layer is less than 10 GPa. The pads are located on the buffer insulating layer and disposed on the display area of the substrate. The light emitting diodes are electrically connected to the pads and bonding to the display area of the substrate by the pads. The buffer insulating layer is located between the light emitting diodes and the substrate. A normal projection of the light emitting diodes on the substrate is at least partially overlapped with a normal projection of the buffer insulating layer on the substrate.

In an embodiment of the invention, an overlapping area of each of the normal projections of the light emitting diodes and the buffer insulating layer on the substrate is between 50% and 100% of the projection area of the light emitting diodes on the substrate.

In an embodiment of the invention, each of the light emitting diodes is a horizontal micro light emitting diode and a thickness of each of the light emitting diodes ranges between 4 microns and 10 microns.

In an embodiment of the invention, each of the light emitting diodes includes a first type semiconductor layer, a second type semiconductor layer, an active layer, an insulating layer, a first type electrode, and a second type electrode. The active layer is located between the first type semiconductor layer and the second type semiconductor layer. The first type semiconductor layer is located between the active layer and the buffer insulating layer. The insulating layer is located between the first type semiconductor layer and the substrate and has a first contact opening and a second contact opening. The first type electrode extends into the first contact opening and is electrically connected to the first type semiconductor layer. The second type electrode extends from into the second contact opening and is electrically connected to the second type semiconductor layer.

In an embodiment of the invention, each of the light emitting diodes further includes a blind hole, and the blind hole sequentially passes through the first type semiconductor layer and the active layer, to expose the second type semiconductor layer. The second contact opening of the insulating layer is further disposed in the blind hole.

In an embodiment of the invention, the display panel further includes a first electrode layer and a second electrode layer. The first electrode layer is disposed on an upper surface of the substrate. The second electrode layer is disposed on the first electrode layer and the buffer insulating layer, and the buffer insulating layer has a plurality of first openings. Part of the second electrode layer extends into the first opening and is electrically connected to the first electrode layer. The light emitting diodes are electrically connected to the second electrode layer through the pads.

In an embodiment of the invention, the first electrode layer includes a plurality of first type electrode lines separated from one another. The second electrode layer includes a plurality of connecting portions and a plurality of second type electrode lines separated from one another. The connecting portions are electrically connected to the first type electrodes of the light emitting diodes, the second type electrode lines are electrically connected to the second type electrodes of the light emitting diodes, and the connecting portions extend into the first openings of the buffer insulating layer and are electrically connected to the first electrode layer.

In an embodiment of the invention, the display panel further includes an inorganic insulating layer disposed on the upper surface of the substrate and located between the buffer insulating layer and the substrate. The inorganic insulating layer covers the upper surface and the first electrode layer and has a plurality of second openings. The second openings are connected through the first openings of the buffer insulating layer. Part of the second electrode layer extends into and is disposed in the first openings and the second openings and is electrically connected to the first electrode layer.

In an embodiment of the invention, the buffer insulating layer is a patterned film layer. A normal projection of the buffer insulating layer on the substrate is substantially overlap to a normal projection of the second electrode layer on the substrate.

In an embodiment of the invention, the display panel further includes an inorganic insulating layer disposed between the second electrode layer and the buffer insulating layer and covered the buffer insulating layer. The inorganic insulating layer has a plurality of second openings located in the first openings of the buffer insulating layer. Part of the second electrode layer is disposed in the second openings and is electrically connected to the first electrode layer.

In an embodiment of the invention, each of the light emitting diodes is a vertical micro light emitting diode and a thickness of each of the light emitting diodes ranges between 4 microns and 10 microns.

In an embodiment of the invention, the display panel further includes a plurality of first electrode lines disposed on the buffer insulating layer and separated from one another. The first electrode lines are respectively located between the pads and the buffer insulating layer, and the light emitting diodes are respectively bonding to the first electrode lines through the pads.

In an embodiment of the invention, the display panel further includes a plurality of second electrode lines respectively disposed on the light emitting diodes. The light emitting diodes are respectively located between the second electrodes and the first electrodes.

In an embodiment of the invention, a thickness of the buffer insulating layer ranges between 3 microns and 5 microns.

In an embodiment of the invention, a material of the buffer insulating layer is an organic material.

In an embodiment of the invention, the Young's modulus of the buffer insulating layer ranges between 2.9 GPa and 3.6 GPa.

In an embodiment of the invention, the residual stress of the buffer insulating layer ranges between 25 MPa and 45 MPa.

In an embodiment of the invention, the elongation at break of the buffer insulating layer ranges between 5% and 10%.

In an embodiment of the invention, the substrate includes a sapphire substrate, a glass substrate, a thin film transistor (TFT) substrate, a primary adhesive submount, a complementary metal-oxide-semiconductor (CMOS) circuit substrate, or a liquid crystal on silicon (LCOS) substrate.

In an embodiment of the invention, a length of each of the light emitting diodes ranges between 3 microns and 100 microns, and a thickness of each of the pads ranges between 0.1 microns and 10 microns To sum up, the display panel of the embodiments of the invention has the buffer insulating layer, and the Young's modulus of the buffer insulating layer is less than 10 GPa, such that, when the light emitting diodes are electrically connected to the pads and are bonding onto the substrate through the pads, the buffer insulating layer is able to absorb the stress generated during bonding, and that bonding yield rates are increased and structural reliability of the display panel provided by the embodiments of the invention is further enhanced.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
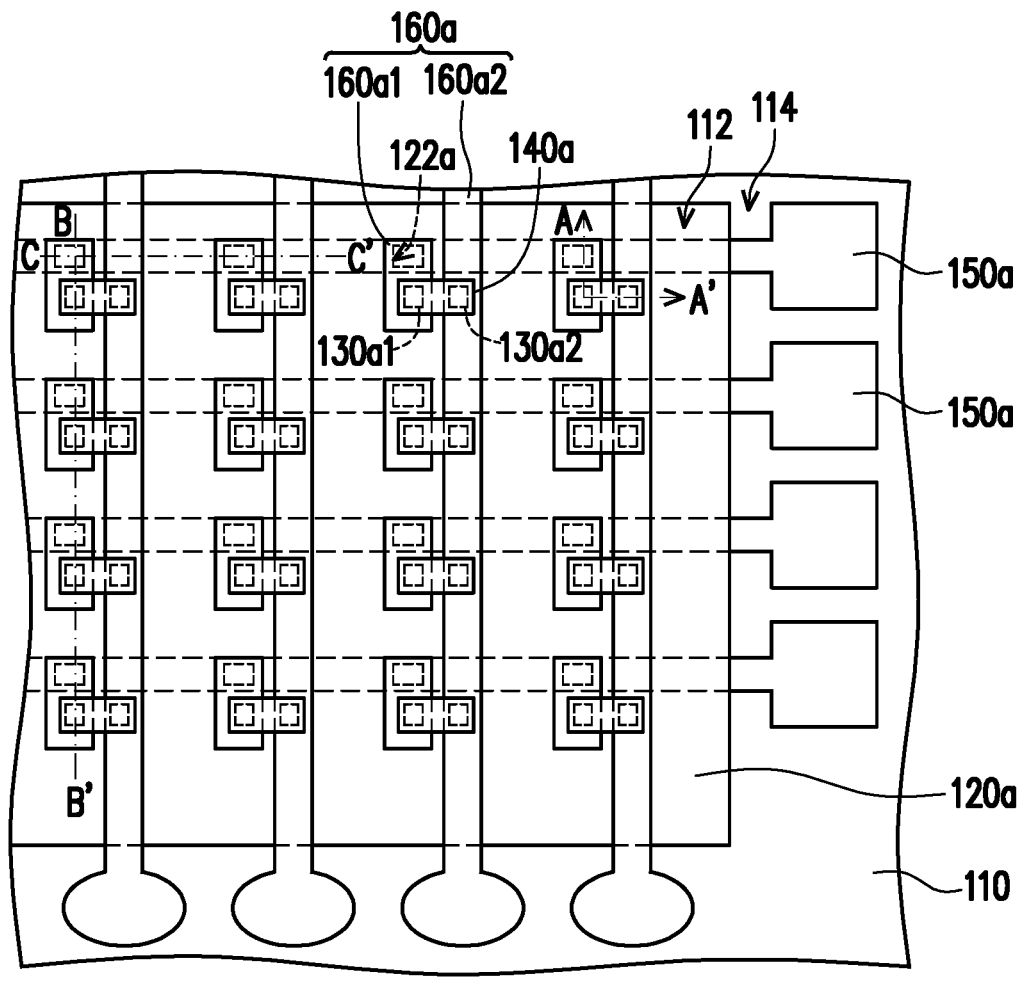
FIG. 1A illustrates a schematic top view of a display panel according to an embodiment of the invention.
Figure 1B:
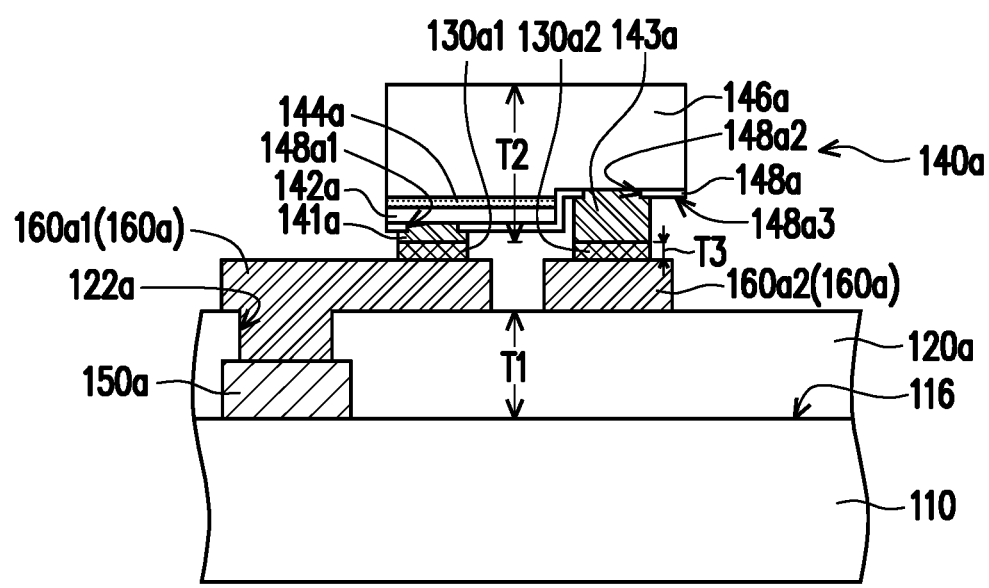
FIG. 1B illustrates a schematic cross-sectional view along a line A-A' of FIG. 1A.

FIG. 1A illustrates a schematic top view of a display panel according to an embodiment of the invention. FIG. 1B illustrates a schematic cross-sectional view along a line A-A' of FIG. 1A. Referring to FIG. 1A and FIG. 1B together, in the present embodiment, a display panel 100a includes a substrate 110, a buffer insulating layer 120a, a plurality of pads 130a1 and 130a2, and a plurality of light emitting diodes 140a. The substrate 110 has a display area 112 and a peripheral area 114 adjacent to the display area 112. The pads 130a1 and 130a2 and the light emitting diodes 140a are disposed in the display area 112, and the light emitting diodes 140a are electrically connected to the substrate 110 by the pads 130a1 and 130a2. In the present embodiment, the light emitting diodes 140a having a plurality of colors and disposed in a pixel array in the display area 112 are controlled to emit light to show image by a driving circuit (not shown) or an external IC (not shown). The buffer insulating layer 120a is located between the light emitting diodes 140a and the substrate 110, and the Young's modulus of the buffer insulating layer 120a is less than 10 GPa. A normal projection of the light emitting diodes 140a on the substrate 110 is at least partially overlapped with a normal projection of the buffer insulating layer 120a on the substrate 110.

Specifically, the substrate 110 of the present embodiment may be, for example, a wire-designed substrate such as a sapphire substrate or a glass substrate and controls the light emitting diodes 140a through a passively-driven external IC. Alternatively, the substrate 110 may be a substrate with a driving circuit such as a thin film transistor (TFT) substrate, a primary adhesive submount, a complementary metal-oxide-semiconductor (CMOS) circuit substrate, a liquid crystal on silicon (LCOS) substrate, or other suitable driving circuit substrates and controls the light emitting diodes 140a through an actively-driven IC circuit. Certainly, in different embodiments, the display panel 100a may also be a static image display, an illuminating apparatus, etc. delivering merely light emission of single color. The invention is not limited thereto.

Particularly, a material of the buffer insulating layer 120a of the present embodiment is an organic material, for example, a photoresist material, benzocyclobutene (BCB), polyimide (PI), an organic rubber material, etc. Moreover, a thickness T1 of the buffer insulating layer 120a ranges between 3 microns and 5 microns, the residual stress of the buffer insulating layer 120a ranges between 25 MPa and 45 MPa, for example, 34 MPa, and the elongation at break of the buffer insulating layer 120a ranges between, for example, 5% and 10%. Preferably, the Young's modulus of the buffer insulating layer 120a ranges between 2.9 GPa and 3.6 GPa. As such, the buffer insulating layer 120a can provide stress buffering effect between two materials with different thermal expansion coefficient, for example, the light emitting diodes 140a and the substrate 110.

Referring to FIG. 1B, in the present embodiment, the light emitting diodes 140a are implemented as horizontal micro light emitting diodes (micro LEDs). Each of the light emitting diodes 140a includes a first type semiconductor layer 142a, an active layer 144a, a second type semiconductor layer 146a, an insulating layer 148a, a first type electrode 141a, and a second type electrode 143a. The active layer 144a is located between the first type semiconductor layer 142a and the second type semiconductor layer 146a. The first type semiconductor layer 142a is located between the active layer 144a and the buffer insulating layer 120a. The insulating layer 148a is disposed on the first type semiconductor layer 142a and has a first contact opening 148a1 and a second contact opening 148a2. The first type electrode 141a extends from a surface 148a3 of the insulating layer 148a into the first contact opening 148a1 and is electrically connected to the first type semiconductor layer 142a. The second type electrode 143a extends from the surface 148a3 of the insulating layer 148a into the second contact opening 148a2 and is electrically connected to the second type semiconductor layer 146a. As such, the second type electrode 143a is electrically isolated from the first type semiconductor layer 142a and the active layer 144a by the insulating layer 148a.

Furthermore, in the present embodiment, the pads 130a1 and 130a2 are separated from each other. The first type electrodes 141a of the light emitting diodes 140a are electrically connected to the pad 130a1, and the second electrodes 143a of the light emitting diodes 140a are electrically connected to the pad 130a2, such that the light emitting diodes 140a are bonding to the substrate 110. In other words, the light emitting diodes 140a are bonding to the substrate 110 through flip chip type. Herein, a thickness T2 of each of the light emitting diodes 140a ranges, for example, between 4 microns and 10 microns, and better between 5 microns and 8 microns. A thickness T3 of each of the pads 130a1 (or each of the pads 130a2) ranges, for example, between 0.1 microns and 10 microns.

In addition, referring to FIG. 1A and FIG. 1B, the display panel 100a of the present embodiment further includes a first electrode layer 150 and a second electrode layer 160. Moreover, the first electrode layer 150 is disposed on an upper surface 116 of the substrate 110, and buffer insulating layer 120a is disposed on the first electrode layer 150, and the second electrode layer 160 is disposed on the buffer insulating layer 120a. The first electrode layer 150 includes a plurality of first type electrode lines 150a separated from one another, and the second electrode layer 160 includes a plurality of second type electrode lines 160a2 separated from one another and a plurality of connecting portions 160a1. The buffer insulating layer 120a has a plurality first openings 122a located between the first electrode lines 150a and the connecting portions 160a1 of the second electrode layer 160. The connecting portions 160a1 of the second electrode layer 160 extend into the first openings 122a and are electrically connected to the corresponding first type electrode lines 150a. In each of the light emitting diodes 140a, the first type electrode 141a is electrically connected to one of the first type electrode lines 150a through the pad 130a1 and the second type-electrode 143a is electrically connected to one of the second type electrode lines 160a2 through the pad 130a2. Furthermore, a first type electrical carrier a second type electrical carrier are provided through an external power source circuit and other circuit devices, the first type electrical carrier enters the first type semiconductor layer 142a through the first type electrode lines 150a, the connecting portions 160a1, and the pad 130a1, and the second type electrical carrier enters the second type semiconductor layer 146a through the second type electrode lines 160a2 and the pad 130a2. As such, an electrical path is formed to enable the light emitting diodes 140a to emit lights.

In short, the display panel 100a of the present embodiment has the buffer insulating layer 120a, and the Young's modulus of the buffer insulating layer 120a is less than 10 GPa, such that, when the light emitting diodes 140a are bonding onto the substrate 110, the buffer insulating layer 120a is able to decrease the damage by the bonding stress. As such, bonding yield rates are increased, and that processing yield rates and structural reliability of the display panel 100a of the present embodiment are enhanced.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 1C:
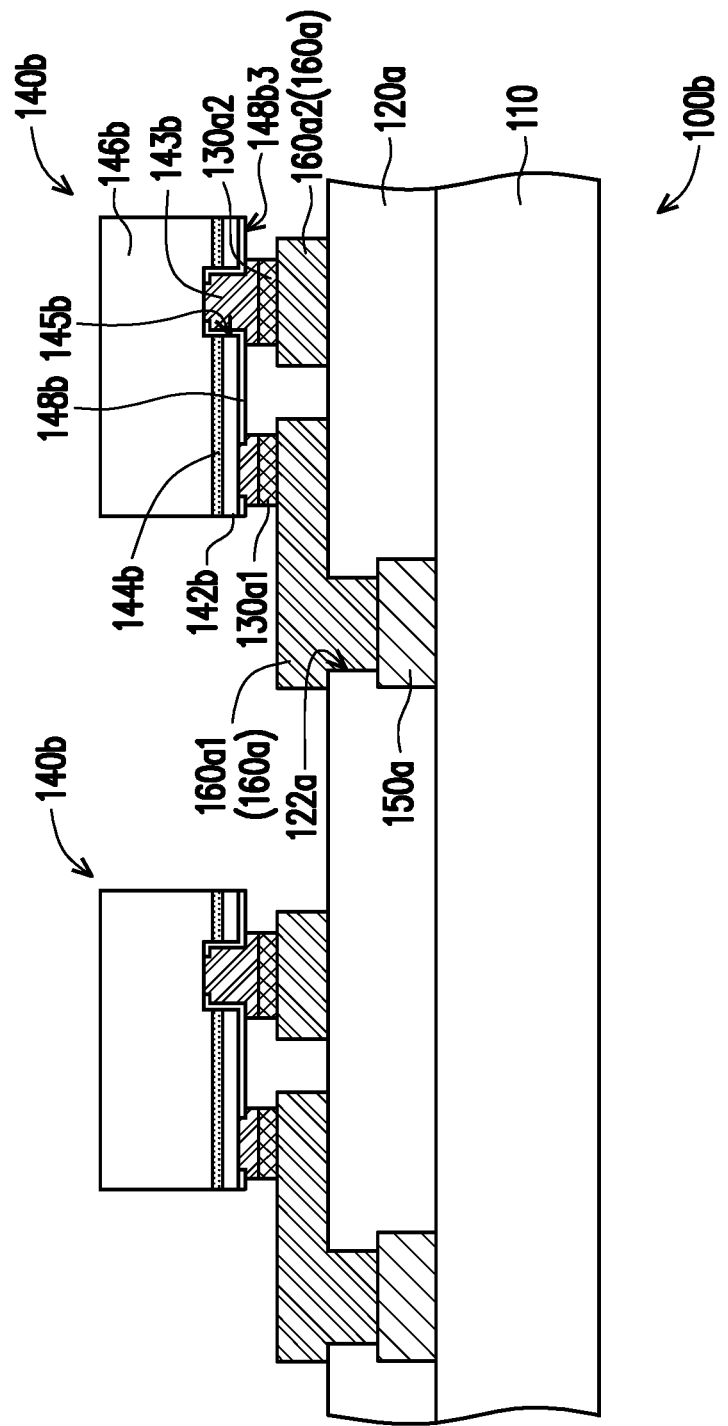
FIG. 1C illustrates a schematic local cross-sectional view of a display panel according to another embodiment of the invention.

FIG. 1C illustrates a partial cross-sectional schematic view of a display panel according to another embodiment of the invention. Referring to FIG. 1B and FIG. 1C together, a display panel 100b of the present embodiment is similar to the display panel 100a of FIG. 1B, but a difference therebetween is that light emitting diodes 140b of the present embodiment are different from the light emitting diodes 140a of FIG. 1B. Specifically, each of the light emitting diodes 140b of the present embodiment further includes a blind hole 145b, and the blind hole 145b sequentially passes through a first type semiconductor layer 142b, an active layer 144b, and a partial of a second type semiconductor layer 146b. An insulating layer 148b covers the surface of the first type semiconductor layer 142b and extends to the blind hole 145b to dispose on an inner wall of the blind hole 145b. A second type electrode 143b extends from a surface 148b3 of the insulating layer 148b into the blind hole 145b. A second contact opening 148a2 is also located in the blind hole 145b to expose the second type semiconductor layer 146b and to enable the second type electrode 143b to be in electrical contact with the second type semiconductor layer 146b.

Figure 1D:
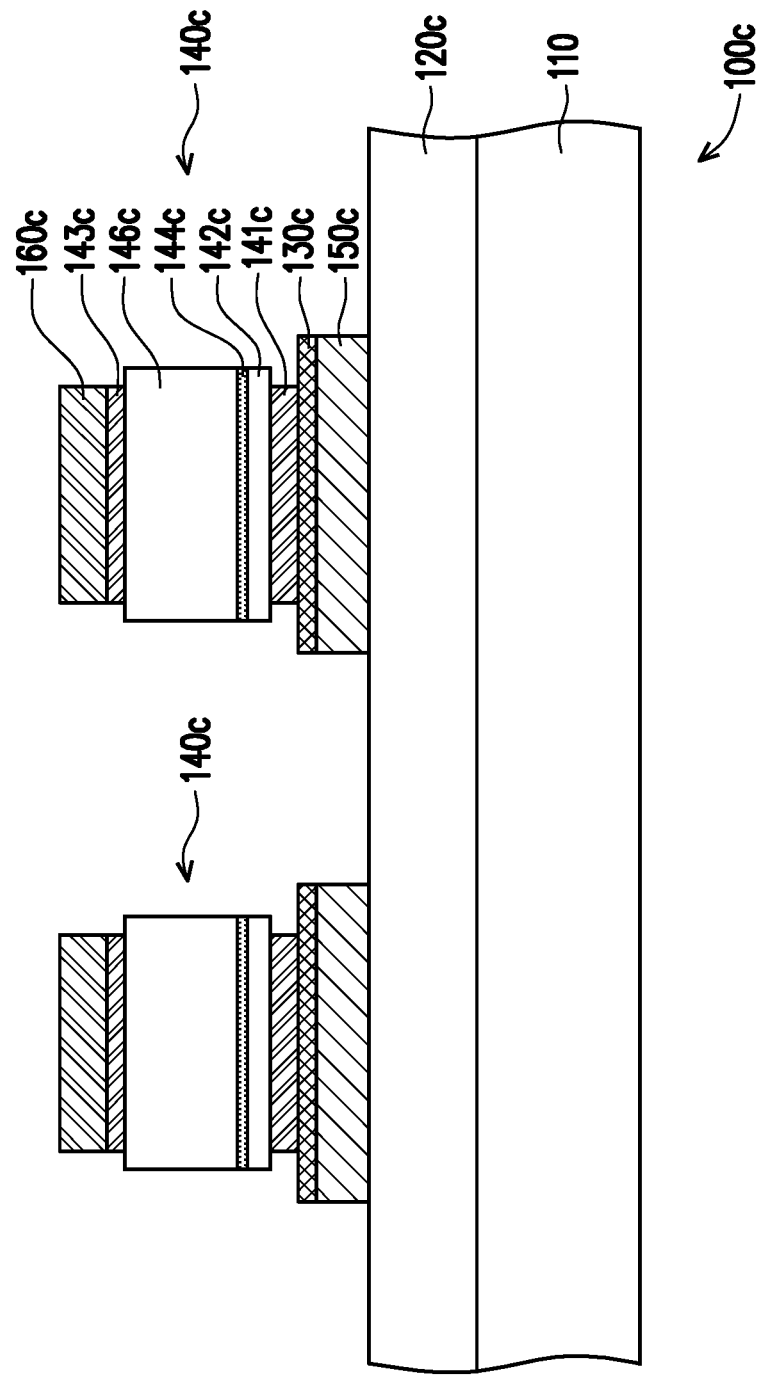
FIG. 1D illustrates a partial cross-sectional schematic view of a display panel according to another embodiment of the invention.

FIG. 1D illustrates a partial cross-sectional schematic view of a display panel according to another embodiment of the invention. A display panel 100c of the present embodiment includes a substrate 110, a buffer insulating layer 120c, a plurality of pads 130c, a plurality of light emitting diodes 140c, a first electrode layer 150, and a second electrode layer 160.

Specifically, in the present embodiment, the light emitting diodes 140c are implemented as vertical light emitting diodes. Each of the light emitting diodes 140c includes a first type semiconductor layer 142c, an active layer 144c, a second type semiconductor layer 146c, a first type electrode 141c, and a second type electrode 143c. The active layer 144c is located between the first type semiconductor layer 142c and the second type semiconductor layer 146c. The first type electrode 141c is located between the first type semiconductor layer 142c and a pad 130c. The second type electrode 143c is disposed on the second type semiconductor layer 146c. In other words, the first type electrode 141c and the second type electrode 143c are respectively located on two sides of the active layer 144c. Furthermore, the buffer insulating layer 120c of the present embodiment is disposed on the substrate 110, and the first electrode layer 150 is disposed on the buffer insulating layer 120c and includes a plurality of first type electrode lines 150c separated from one another. The light emitting diodes 140c are respectively bonding to the corresponding first type electrode lines 150c by the pads 130c. Similarly, a normal projection of the light emitting diodes 140c on the substrate 110 overlaps with a normal projection of the buffer insulating layer 120c on the substrate 110. As such, bonding stress is decreased through the buffer insulating layer 120c, and bonding yield will be improved.

In can be seen from FIG. 1B, FIG. 1C, and FIG. 1D that the invention is not limited to the types of the light emitting diodes 140a, 140b, and 140c. As long as the buffer insulating layers 120a and 120c adopting organic materials are disposed between the light emitting diodes 140a, 140b, and 140c and the substrate 110, it will be within the scope of the present invention seeking to protect.

Figure 2A:
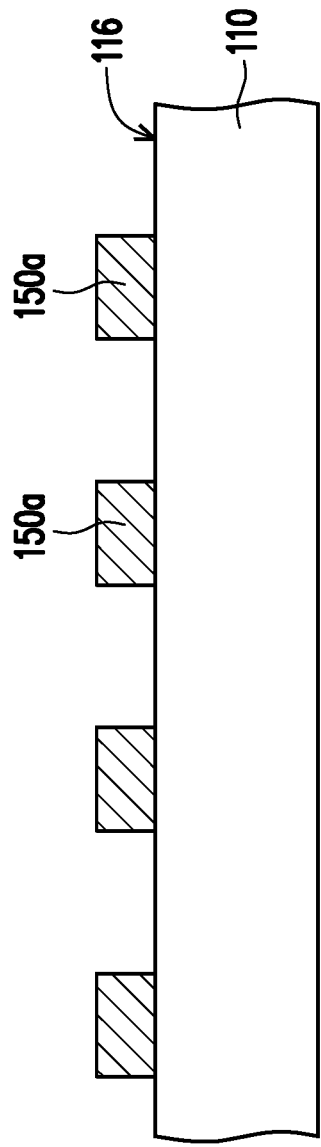
FIG. 2A to FIG. 2E illustrate schematic cross-sectional views of a manufacturing method of the display panel of FIG. 1A.
Figure 2B:
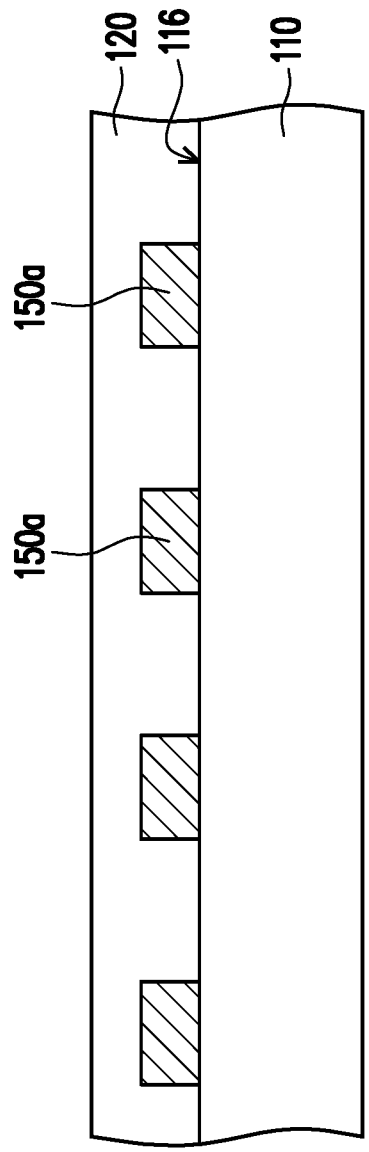
Figure 2C:
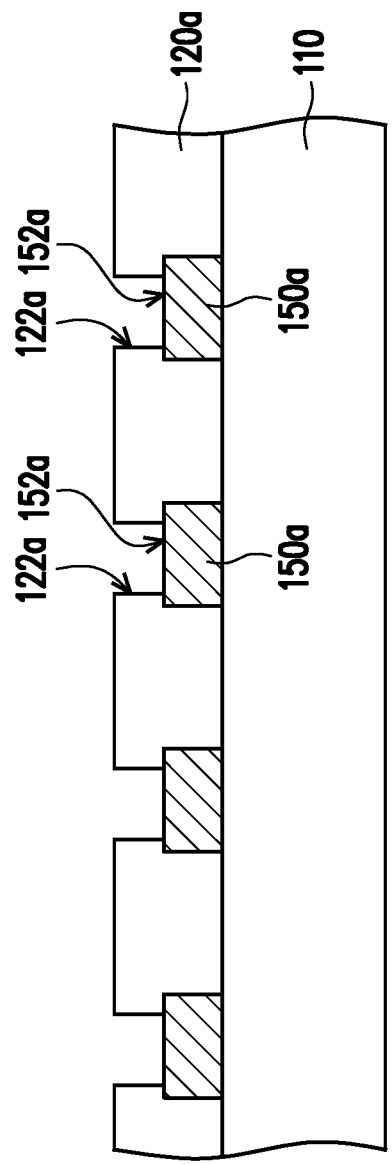
Figure 2D:
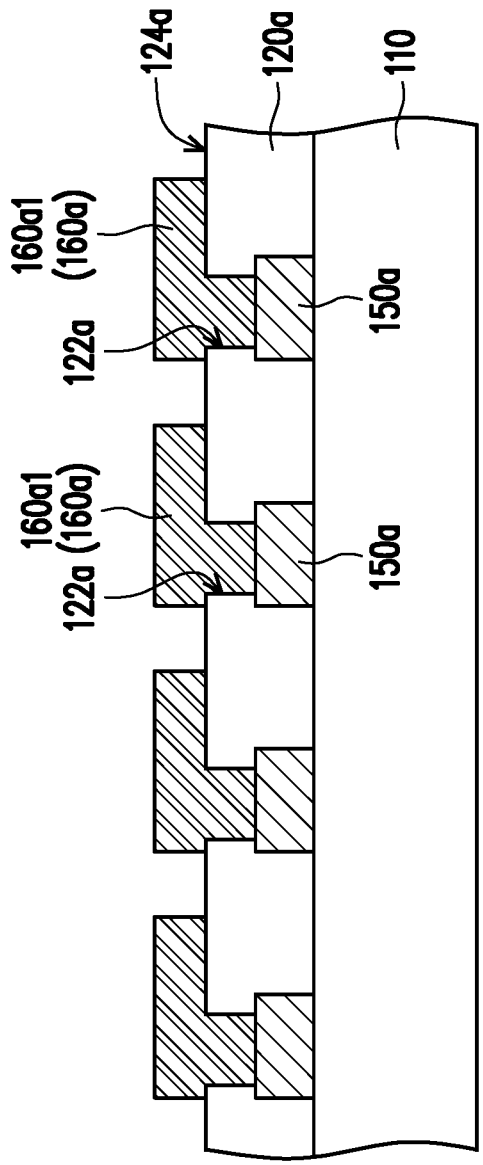
Figure 2E:
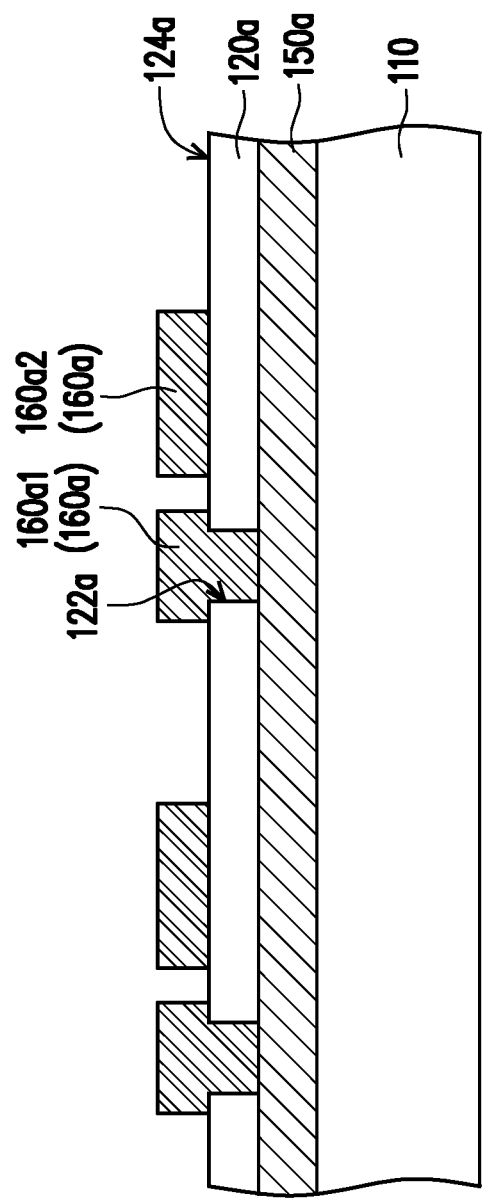

FIG. 2A to FIG. 2E illustrate schematic cross-sectional views of a manufacturing method of the display panel of FIG. 1A. It should be explained that FIG. 2A to FIG. 2D are cross-sectional views taken along a line B-B' of FIG. 1A, and FIG. 2E is a cross-sectional view taken along a line C-C' of FIG. 1A. During the process, referring to FIG. 1A and FIG. 2A together, according to a manufacturing method of the display panel of the present embodiment, the substrate 110 is provided first, and then the first type electrode lines 150a separated from one another are formed on the upper surface 116 of the substrate 110. Next, referring to FIG. 1A and FIG. 2B together, a buffer insulating material layer 120 is formed on the upper surface 116 of the substrate 110 and covers the upper surface 116 and the first type electrode lines 150a. A manufacturing method of the first type electrode lines 150a is that an entire film layer of the first electrode layer is first deposited and then defined through photolithography and etching; alternatively, is formed through evaporation after a pattern is defined by using a mask. In the present embodiment, the first type electrode lines 150a are separated from one another and extend from the display area 112 to the peripheral area 114 to be electrically connected to an external circuit (not shown).

Next, referring to FIG. 1A and FIG. 2C together, the first openings 122a are formed on the buffer insulating material layer 120 to expose part of upper surfaces 152a of the first type electrode lines 150a, so as to complete manufacturing of the buffer insulating layer 120a. Afterwards, referring to FIG. 2D and FIG. 2E together, the patterned second electrode layer 160 is formed on the buffer insulating layer 120a, so as to manufacture the connecting portions 160a1 and the second type electrode lines 160a2 independent from one another. Moreover, the connecting portions 160a1 extend from a surface 124a of the buffer insulating layer 120a into the first openings 122a and are electrically connected to the first type electrode lines 150a, and the second type electrode lines 160a2 are disposed on the surface 124a of the buffer insulating layer 120a and are separated from and arranged alternately with the connecting portions 160a1. In the present embodiment, the second type electrode lines 160a2 extend from the display area 112 to the peripheral area 114 to be electrically connected to an external circuit (not shown), and the external circuit provides a driving current to enable the light emitting diodes 140a to emit lights through the first type electrode lines 150a and the second type electrode lines 160a2. Nevertheless, the invention is not limited to the circuit design of the first type electrode lines 150a and the second type electrode lines 160a2. The first type electrode lines 150a and the second type electrode lines 160a2 may also be formed in the display area 112 and connected to lines in the substrate 110 for providing currents for the light emitting diodes 140a.

At last, as shown in FIG. 1A, the pads 130a1 and 130a2 are formed on the connecting portions 160a1 and the second type electrode lines 160a2, and the light emitting diodes 140a are bonding onto the substrate 110 corresponding to the pads 130a1 and 130a2. Moreover, the light emitting diodes 140a are bonding to the substrate 110 and electrically connected to the pads 130a1 and 130a2. Accordingly, the manufacturing of the display panel 100a is completed.

Figure 3:
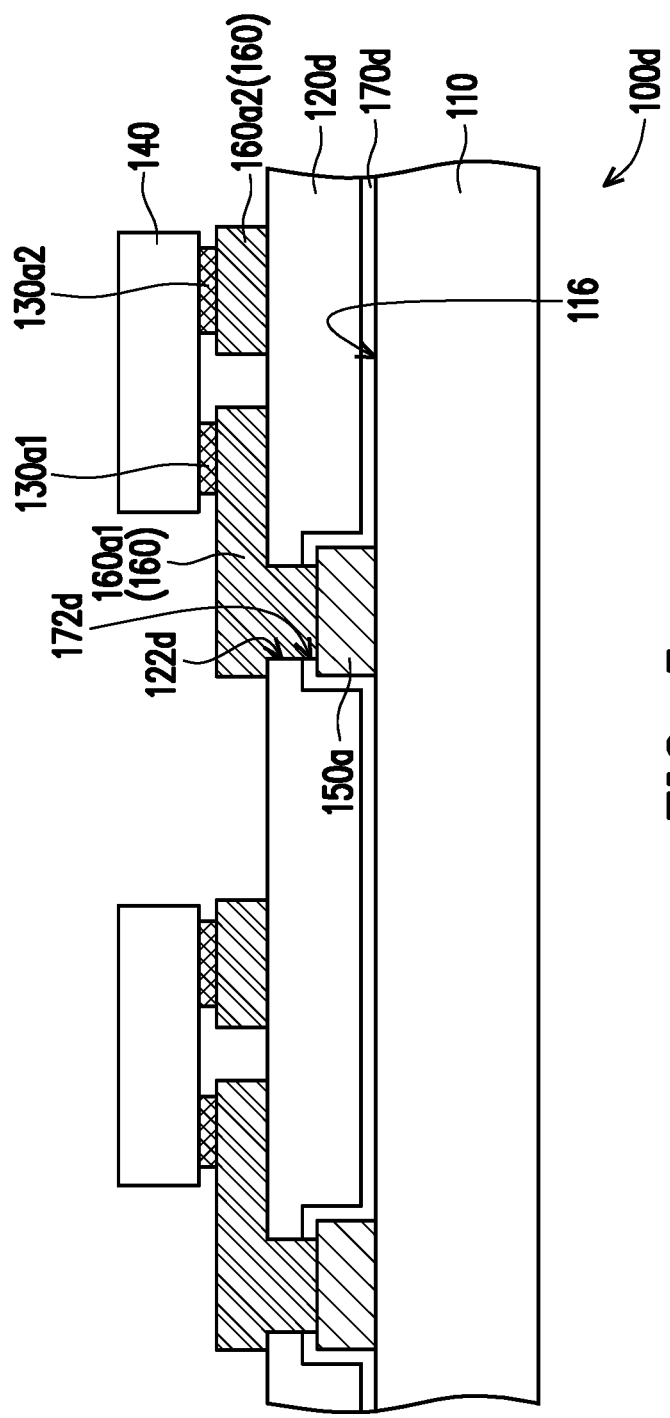
FIG. 3 illustrates a partial cross-sectional schematic view of a display panel according to another embodiment of the invention.

FIG. 3 illustrates a partial cross-sectional schematic view of a display panel according to another embodiment of the invention. Referring to FIG. 1B and FIG. 3 together, a display panel 100d of the present embodiment is similar to the display panel 100a of FIG. 1B, but a difference therebetween is that the display panel 100d of the present embodiment further includes an inorganic insulating layer 170d, and the inorganic insulating layer 170d is disposed on the upper surface 116 of the substrate 110 and located between a buffer insulating layer 120d and the substrate 110. The inorganic insulating layer 170d covers the upper surface 116 and the first type electrode lines 150a and has a plurality of second openings 172d. The second openings 172d are disposed corresponding to first openings 122d of the buffer insulating layer 120d and are connected through the first openings 122d. Moreover, a diameter of each of the second openings 172d is substantially identical to a diameter of each of the first openings 122d. The connecting portions 160a1 of the second electrode layer 160 extend to be disposed into the first openings 122d and the second openings 172d and are electrically connected to the first type electrode lines 150a. Herein, a thickness of the inorganic insulating layer 170d is considerably less than a thickness of the buffer insulating layer 120d. Furthermore, a material of the inorganic insulating layer 170d includes, for example, silicon dioxide ($SiO_2$) or silicon nitride (SiN). The inorganic insulating layer 170d is disposed for improving structural reliability and enhancing manufacturing yield. Besides, the light emitting diodes 140 illustrated here may be the foregoing light emitting diode 140a or the light emitting diode 140b, and the invention is not limited thereto.

Figure 4:
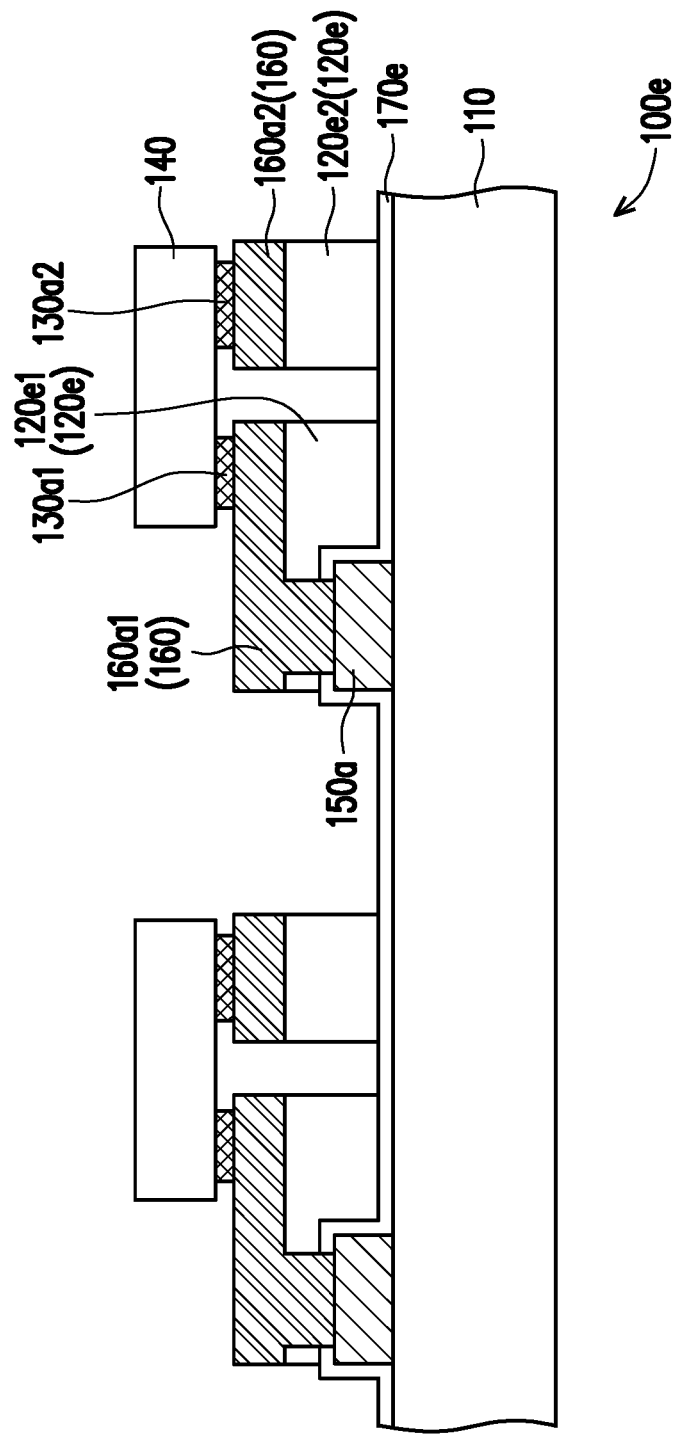
FIG. 4 illustrates a partial cross-sectional schematic view of a display panel according to another embodiment of the invention.

FIG. 4 illustrates a partial cross-sectional schematic view of a display panel according to another embodiment of the invention. Referring to FIG. 3 and FIG. 4 together, a display panel 100e of the present embodiment is similar to the display panel 100d of FIG. 3, but a difference therebetween is that a buffer insulating layer 120e of the present embodiment is designed to be patterned and is formed below the second electrode layer 160. Preferably, an overlapping area between normal projections of the light emitting diodes 140 and the buffer insulating layer 120e on the substrate 110 is between 50% and 100% of a normal projection area of the light emitting diodes 140 on the substrate 110. In other words, the normal projection of the light emitting diodes 140 on the substrate 110 is partially or completely overlapped with the normal projection of the buffer insulating layer 120e on the substrate 110. Herein, a pattern of the buffer insulating layer 120e is similar to a pattern of the second electrode layer 160. To be more specifically, the patterns of the second electrode layer 160 and the buffer insulating layer 120e may be manufactured by an identical etching process, as such, an edge of the pattern of the buffer insulating layer 120e is aligned with an edge of the connecting portion 160a1 and aligned with an edge of the second type electrode line 160a2 together. Here, a thickness of the inorganic insulating layer 170e is considerably less than a thickness of the buffer insulating layer 120e. Besides, the light emitting diode 140 illustrated here may be the foregoing light emitting diode 140a or the light emitting diode 140b, and the invention is not limited thereto.

Figure 5:
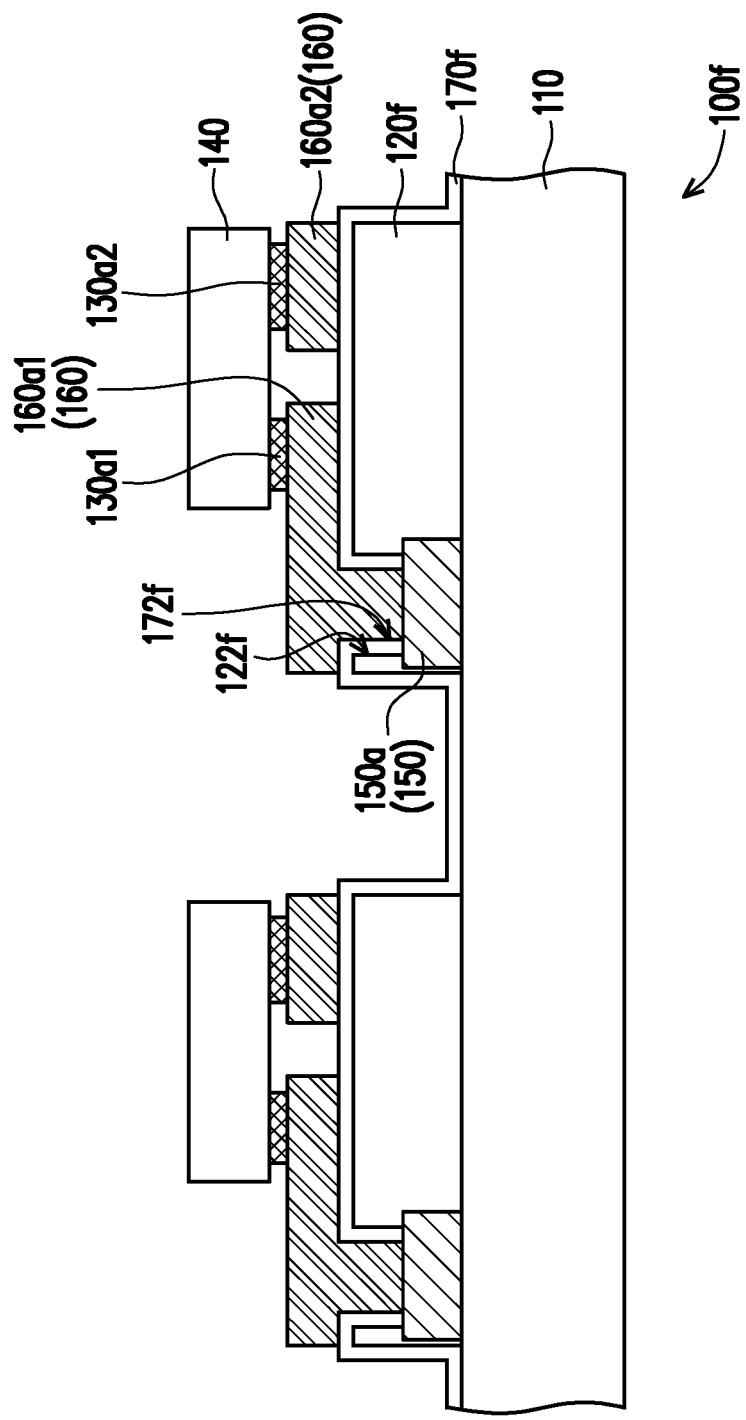
FIG. 5 illustrates a partial cross-sectional schematic view of a display panel according to another embodiment of the invention.

FIG. 5 illustrates a partial cross-sectional schematic view of a display panel according to another embodiment of the invention. Referring to FIG. 3 and FIG. 5 together, a display panel 100f of the present embodiment is similar to the display panel 100d of FIG. 3, but a difference therebetween includes that the display panel 100f of the present embodiment further includes an inorganic insulating layer 170f and a patterned buffer insulating layer 120f. Moreover, the inorganic insulating layer 170f is disposed between the second electrode layer 160 and the buffer insulating layer 120f and extends to and is disposed on the upper surface 116 of the substrate 110 and inner walls of first openings 122f. A pattern is formed by the buffer insulating layer 120f corresponding to the second electrode layer 160 and the light emitting diodes 140, as such, when the light emitting diodes 140 are bonding, the second electrode layer 160 is also equipped the stress generated when the buffer insulating layer 120f performs buffering and bonding. Moreover, the inorganic insulating layer 170f has a plurality of second openings 172f, and the second openings 172f are disposed correspondingly to the first openings 122f of the buffer insulating layer 120f. A diameter of each of the second openings 172f is less than a diameter of each of the first openings 122f. The connecting portions 160a1 of the second electrode layer 160 extend to and are disposed into the second openings 172f and thus are electrically connected to the first electrode layer 150. Herein, a thickness of the inorganic insulating layer 170f is considerably less than a thickness of the buffer insulating layer 120f. Besides, the light emitting diode 140 illustrated here may be the foregoing light emitting diode 140a or the light emitting diode 140b, and the invention is not limited thereto.

In view of the foregoing, the display panel of the embodiments of the invention has the buffer insulating layer, and the Young's modulus of the buffer insulating layer is less than 10 GPa, such that, when the light emitting diodes are electrically connected to the pads and are bonding onto the substrate through the pads, the buffer insulating layer is able to absorb the stress generated during bonding, and that bonding yield rates are increased, and structural reliability of the display panel provided by the embodiments of the invention is further enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel, comprising:
a substrate, having a display area and a peripheral area adjacent to the display area;
a buffer insulating layer disposed on the substrate, wherein the Young's modulus of the buffer insulating layer is less than 10 GPa;
a plurality of pads located on the buffer insulating layer and disposed on the display area of the substrate; and
a plurality of light emitting diodes electrically connected to the pads and bonding to the display area of the substrate by the pads, wherein the buffer insulating layer is located between the light emitting diodes and the substrate, and a normal projection of the light emitting diodes on the substrate is completely overlapped with a normal projection of the buffer insulating layer on the substrate,
wherein each of the light emitting diodes comprises an active layer, and the plurality of pads are located between the active layer and the buffer insulating layer.

2. The display panel as claimed in claim 1, wherein each of the light emitting diodes is a horizontal micro light emitting diode and a thickness of each of the light emitting diodes ranges between 4 microns and 10 microns.

3. The display panel as claimed in claim 2, wherein each of the light emitting diodes comprises a first type semiconductor layer, a second type semiconductor layer, the active layer, an insulating layer, a first type electrode, and a second type electrode, the active layer is located between the first type semiconductor layer and the second type semiconductor layer, the first type semiconductor layer is located between the active layer and the buffer insulating layer, the insulating layer is located between the first type semiconductor layer and the substrate and has a first contact opening and a second contact opening, the first type electrode extends into the first contact opening and is electrically connected to the first type semiconductor layer, and the second type electrode extends into the second contact opening and is electrically connected to the second type semiconductor layer.

4. The display panel as claimed in claim 3, wherein each of the light emitting diodes further comprises a blind hole which sequentially passes through the first type semiconductor layer and the active layer to expose the second type semiconductor layer, and the second contact opening of the insulating layer is further disposed in the blind hole.

5. The display panel as claimed in claim 3, further comprising:
a first electrode layer disposed on an upper surface of the substrate; and
a second electrode layer disposed on the first electrode layer and the buffer insulating layer, wherein the buffer insulating layer has a plurality of first openings, part of the second electrode layer extends into the first openings and is electrically connected to the first electrode layer, and the light emitting diodes are electrically connected to the second electrode layer through the pads.

6. The display panel as claimed in claim 5, wherein the first electrode layer comprises a plurality of first type electrode lines separated from one another, the second electrode layer comprises a plurality of connecting portions and a plurality of second type electrode lines separated from one another, the connecting portions are electrically connected to the first type electrodes of the light emitting diodes, the second type electrode lines are electrically connected to the second type electrodes of the light emitting diodes, and the connecting portions extend into the first openings of the buffer insulating layer and are electrically connected to the first electrode layer.

7. The display panel as claimed in claim 5, further comprising:
an inorganic insulating layer disposed on the upper surface of the substrate and located between the buffer insulating layer and the substrate, wherein the inorganic insulating layer covers the upper surface and the first electrode layer and has a plurality of second openings, the second openings are connected through the first openings of the buffer insulating layer, and part of the second electrode layer extends into the first openings and the second openings and is electrically connected to the first electrode layer.

8. The display panel as claimed in claim 5, wherein the buffer insulating layer is a patterned film layer, and a normal projection of the buffer insulating layer on the substrate is substantially overlap to a normal projection of the second electrode layer on the substrate.

9. The display panel as claimed in claim 5, further comprising:
an inorganic insulating layer disposed between the second electrode layer and the buffer insulating layer and covered the buffer insulating layer, wherein the inorganic insulating layer has a plurality of second openings located in the first openings of the buffer insulating layer, and part of the second electrode layer is disposed in the second openings and to be electrically connected to the first electrode layer.

10. The display panel as claimed in claim 1, wherein each of the light emitting diodes is a vertical micro light emitting diode and a thickness of each of the light emitting diodes ranges between 4 microns and 10 microns.

11. The display panel as claimed in claim 10, further comprising:
a plurality of first electrode lines disposed on the buffer insulating layer and separated from each other, wherein the first electrode lines are respectively located between the pads and the buffer insulating layer, and the light emitting diodes are respectively bonding to the first electrode lines through the pads.

12. The display panel as claimed in claim 11, further comprising:
a plurality of second electrode lines respectively disposed on the light emitting diodes, wherein the light emitting diodes are respectively located between the second electrodes and the first electrodes.

13. The display panel as claimed in claim 1, wherein a thickness of the buffer insulating layer ranges between 3 microns and 5 microns.

14. The display panel as claimed in claim 1, wherein a material of the buffer insulating layer is an organic material.

15. The display panel as claimed in claim 1, wherein the Young's modulus of the buffer insulating layer ranges between 2.9 GPa and 3.6 GPa.

16. The display panel as claimed in claim 1, wherein the residual stress of the buffer insulating layer ranges between 25 MPa and 45 MPa.

17. The display panel as claimed in claim 1, wherein the elongation at break of the buffer insulating layer ranges between 5% and 10%.

18. The display panel as claimed in claim 1, wherein the substrate comprises a sapphire substrate, a glass substrate, a thin film transistor substrate, a primary adhesive submount, a complementary metal-oxide-semiconductor circuit substrate, or a liquid crystal on silicon substrate.

19. The display panel as claimed in claim 1, wherein a length of each of the light emitting diodes ranges between 3 microns and 100 microns, and a thickness of each of the pads ranges between 0.1 microns and 10 microns.

* * * * *